United States Patent
Melanson

(10) Patent No.: US 9,613,622 B1
(45) Date of Patent: Apr. 4, 2017

(54) CONVERSATION MANAGEMENT IN A PERSONAL AUDIO DEVICE

(71) Applicant: Cirrus Logic, Inc., Austin, TX (US)

(72) Inventor: John L. Melanson, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 233 days.

(21) Appl. No.: 14/324,286

(22) Filed: Jul. 7, 2014

Related U.S. Application Data

(63) Continuation of application No. 13/022,019, filed on Feb. 7, 2011, now Pat. No. 8,804,974, which is a continuation of application No. 11/367,224, filed on Mar. 3, 2006, now Pat. No. 7,903,825.

(51) Int. Cl.
*H03G 3/20* (2006.01)
*G10L 15/20* (2006.01)

(52) U.S. Cl.
CPC ................................. *G10L 15/20* (2013.01)

(58) Field of Classification Search
USPC ............. 381/51, 74, 106, 103, 108, 92; 704/231–257; 379/88.01–88.04; 375/260, 346; 455/186.1, 343, 550.1; 367/136; 345/619; 725/47
See application file for complete search history.

(56) References Cited

U.S. PATENT DOCUMENTS

| | | |
|---|---|---|
| 4,035,589 A | 7/1977 | Parke |
| 4,628,526 A | 12/1986 | Germer |
| 4,827,458 A | 5/1989 | DAlayer de Costemore |
| 5,182,774 A | 1/1993 | Bourk |
| 5,509,081 A | 4/1996 | Kuusama |
| 5,550,923 A | 8/1996 | Hotvet |
| 5,774,859 A | 6/1998 | Houser et al. |
| 6,173,192 B1 | 1/2001 | Clark |
| 6,597,792 B1 | 7/2003 | Sapiejewski et al. |
| 6,829,361 B2 | 12/2004 | Aarts |
| 6,944,474 B2 | 9/2005 | Rader et al. |
| 7,478,041 B2 * | 1/2009 | Ichikawa ............ G10L 21/0216 379/406.08 |
| 7,680,286 B2 | 3/2010 | Hashimoto et al. |
| 7,903,825 B1 | 3/2011 | Melanson |
| 2001/0046304 A1 * | 11/2001 | Rast ..................... H04R 1/1041 381/74 |
| 2002/0016966 A1 | 2/2002 | Shirato |

(Continued)

OTHER PUBLICATIONS

U.S. Appl. No. 13/022,019, filed Feb. 7, 2011, Melanson.

(Continued)

*Primary Examiner* — Vivian Chin
*Assistant Examiner* — Friedrich W Fahnert
(74) *Attorney, Agent, or Firm* — Mitch Harris, Atty at Law, LLC; Andrew M. Harris

(57) ABSTRACT

A personal audio device that detects speech provides for improved interaction with others. When speech is detected in a microphone output signal of a microphone that measures ambient audio sounds, the audio program being reproduced by the personal audio device may be altered, by attenuating, muting or interrupting the program material. The speech may be provided to a headset that reproduces the program material. The direction of the speech can be used to determine whether the speech is from a person other than the use of the personal audio device.

17 Claims, 4 Drawing Sheets

(56) References Cited

U.S. PATENT DOCUMENTS

| | | |
|---|---|---|
| 2002/0051546 A1 | 5/2002 | Bizjak |
| 2002/0075965 A1 | 6/2002 | Claesson et al. |
| 2002/0193090 A1 | 12/2002 | Sugar et al. |
| 2003/0161097 A1 | 8/2003 | Le et al. |
| 2005/0020223 A1 | 1/2005 | Ellis et al. |
| 2005/0144007 A1 | 6/2005 | Silver et al. |
| 2005/0146534 A1 | 7/2005 | Fong et al. |
| 2006/0121886 A1 | 6/2006 | Maehara et al. |
| 2007/0189544 A1 | 8/2007 | Rosenberg |
| 2009/0046868 A1 | 2/2009 | Engle et al. |

OTHER PUBLICATIONS

Kates, et al. "Multichannel Dynamic-Range Compression Using Digital Frequency Warping", EURASIP Journal on Applied Signal Processing, Nov. 2005, pp. 3003-3014, vol. 2005, No. 18, New York.

Tzur, et al., "Sound Equalization in a Noisy Environment", AES 110th convention conference paper, May 2001, 5 pages (pp. 1-5 in pdf), Amsterdam, NL.

Office Action in U.S. Appl. No. 11/367,224 mailed Feb. 2, 2010, 17 pages (pp. 1-17 in pdf).

Final Office Action in U.S. Appl. No. 11/367,224 mailed Aug. 3, 2010, 19 pages (pp. 1-19 in pdf).

Notice of Allowance in U.S. Appl. No. 11/367,224 mailed Oct. 28, 2010, 6 pages (pp. 1-6 in pdf).

GAI-Tronics, GAI-Tronics, S.M.A.R.T. Module Data Sheet, Pub. 010201A, Mar. 2002, 2 pages (pp. 1-2 in pdf), US.

Office Action in U.S. Appl. No. 13/022,019 mailed Apr. 1, 2013, 11 pages (pp. 1-11 in pdf).

Final Office Action in U.S. Appl. No. 13/022,019 mailed Oct. 21, 2013, 11 pages (pp. 1-11 in pdf).

Notice of Allowance in U.S. Appl. No. 13/022,019 mailed Mar. 28, 2014, 8 pages (pp. 1-8 in pdf).

* cited by examiner

CONVERSATION MANAGEMENT IN A PERSONAL AUDIO DEVICE

The present U.S. Patent Application is a Continuation of U.S. patent application Ser. No. 13/022,019 filed on Feb. 7, 2011, which is a Continuation of U.S. patent application Ser. No. 11/367,224 filed on Mar. 3, 2006, and issued as U.S. Pat. No. 7,903,825 on Mar. 8, 2011, the disclosures of which are incorporated herein by reference and from which priority is claimed under 35 U.S.C. §120.

BACKGROUND OF THE INVENTION

1. Field of the Invention

The present invention relates generally to consumer personal audio playback devices, and more specifically, to a personal audio playback device that alters the gain of playback program material in response to environmental sounds.

2. Background of the Invention

Consumer audio playback devices are in widespread use. Ever since the development of miniaturized cassette players, portable entertainment has permitted people to carry around their desired personal listening material. More recently, miniature players incorporating flash-memory, hard drives and optical storage media to store program material have been developed, and some players incorporate LCD screens that permit the viewing of video information along with the associated audio program.

In order to provide the best listening experience, the headphones used with present-day personal audio devices have improved to the point that outside environmental sounds are attenuated quite severely and the transducers themselves have improved to provide very high acoustic program levels from typically low power levels available from such devices.

Although the increased loudness and environmental attenuation is preferable for uninterrupted listening, the possibility of intrusion of desirable or sounds indicative of danger has also been reduced. For example, it has become increasingly difficult to get the attention of a personal audio device user in order to converse with them, and conversation between persons using personal audio devices tends to be mutually exclusive of such use. For instance, a person generally must turn off or extremely attenuate their program material in order to conduct a conversation, or must remove one or both headphone elements from their ears. As another example, a pedestrian listening to audio via such a device may not notice a vehicle horn or siren that is alerting them to a hazard.

One solution to the above-described problems is to use headphone elements that "leak" more environmental sound into the user's ear, thus permitting the possibility of the environmental sound overcoming the loudness of the program material. However, the use of more leaky headphone elements runs contrary to the desired purpose of providing an isolated listening experience. For example, a headphone element that will provide enough leakage to alert a pedestrian to a car horn would not be suitable for a person desiring to use the same headphones while an undesirable environmental noise is present, such as listening while operating a vacuum cleaner. Further, with the tendency to increase the volume of the program material to overcome undesirable noise, damage to hearing becomes an issue, as the human ear is sensitive to prolonged high volume levels, whether desirable program material or undesirable noise.

Recently, the technique of noise cancellation has been applied to consumer headphones. A microphone detects ambient sounds and a circuit modifies the program audio electrical signals to attempt to subtract the ambient sounds, thus improving the user's listening experience and making it less likely that a user will increase the volume of the program material to overcome ambient sounds. However, such a device does not solve the above-described problems of providing for conversations, and if an environmental noise indicative of a hazard is not sufficiently loud to as to defeat the noise-canceling mechanism, then the noise cancellation will also not produce a desirable result.

Therefore, it would be desirable to provide a personal consumer audio device that provides a quality individual program listening experience in the presence of environmental noise/sounds, while providing for communications with others and awareness of environmental sounds indicative of a hazard.

SUMMARY OF THE INVENTION

The above stated objective of providing a quality individual program listening experience in the presence of environmental noise, while providing for communications and hazard awareness is achieved in a personal audio device.

The device is a portable consumer audio playback device that reproduces audio program information via at least one headphone while measuring ambient audio sounds. The device detects speech in the ambient audio sounds and adjusts a characteristic of the audio program information in response to detecting the speech.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a consumer personal audio playback device that uses gain control of audio signals rendered from internally-stored program information to adapt the volume level of a headphone output to environmental sounds. The gain control is made in conformity with the output of one or more microphone elements integral to the playback device housing that sense environmental sounds and an internal processing circuit adjusts the gain of the headphone output in conformity with the output of the microphone element(s). The microphone element(s) may be the same microphone(s) used to provide recording capability when the personal device is also a recorder. The device may also include subtractive noise-cancellation as a selectable operating mode and, if so, the microphones used to provide input to the noise-cancellation process may be used to provide input to the processing circuit of the present invention. Intelligent algorithms are provided in the processing circuit to analyze the environmental sounds and adjust the gain of the headphone outputs in one or more frequency bands in conformity with the results of the analysis.

Figure 1:
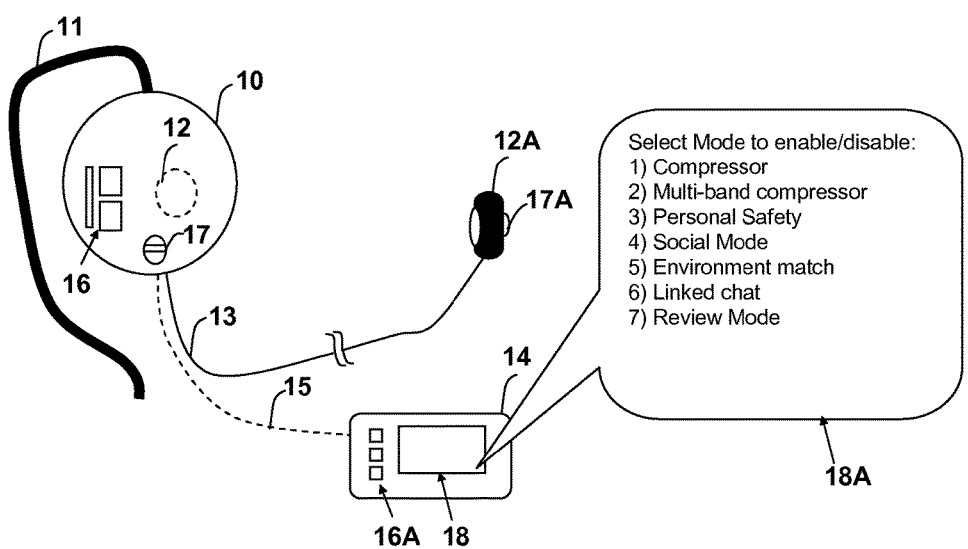
FIG. 1 is an illustration of a consumer personal audio playback device in accordance with an embodiment of the present invention.

Referring now to FIG. 1, a consumer personal audio playback device in accordance with an embodiment of the present invention is shown. A retaining arm 11 is attached to a device housing 10 for retaining device housing 10 to a wearer's ear. An output audio transducer 12 is included on housing 10 to provide audio program information to the wearer from program media stored within housing 10. A microphone element 17 is disposed within housing 10 and acoustically coupled through the surface of housing 10 to detect environmental sounds. However, microphone 17 may alternatively be connected to the device via external wiring, so that the microphone can be located in another location, for example, near the wearer's mouth. A microphone boom (not shown) may be included for that purpose. Another output audio transducer 12A is connected to the device via a wired connection 13 extending external to housing 10 and another microphone element 17A may be included in the packaging of output audio transducer 12A and connected via wired connection 13 as well. A wired or wireless connection 15 to a remote control 14 provides for control of the playback of audio program information via controls 16A and a display 18. Alternatively, or in combination, controls 16 may be included on the surface of device housing 10. Callout 18A shows details of an exemplary selection screen of display 18 in which device mode selections are made by scrolling through the listed options. Selection can be mutually exclusive, or overlapping via enable/disable selections.

Figure 2:
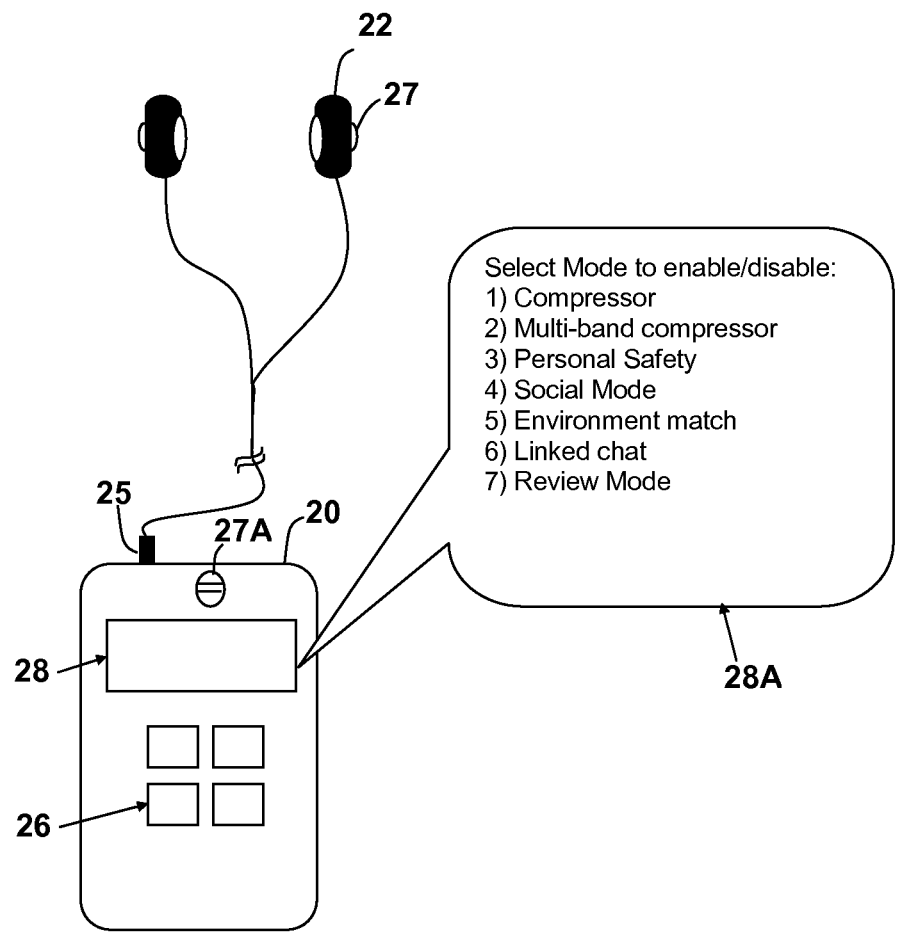
FIG. 2 is an illustration of a consumer personal audio playback device in accordance with another embodiment of the present invention.

Referring now to FIG. 2, a consumer personal audio playback device in accordance with another embodiment of the present invention is shown. A device housing 20 contains the stored program material and circuits for providing an audio signal to a set of headphones, that include at least one audio output transducer 12A and optionally an associated microphone element 27 or elements (one positioned at each ear of a wearer). A connector 25 provides connection of the headphones at the exterior surface of device housing 20. Multiple connectors 25 may be used to connect microphone element(s) 27, or the connections may be combined in one connector 25. Alternatively, or in combination, microphone element 27A may be provided at and acoustically coupled through the surface of device housing 20. A display 28 and controls 26 are also provided at the surface of device housing 20 to control the playback of audio program material. Callout 28A shows details of an exemplary selection screen of display 28 in which device mode selections are made by scrolling through the listed options. Selection can be mutually exclusive, or overlapping via enable/disable selections.

While both of the above-depicted embodiments are particular present forms of consumer audio playback devices, such depictions are not limiting, but exemplary, and the present invention applies in general to devices that provide audio playback of media stored within the device via a headset intended to isolate a wearer acoustically from external sounds, at least to some degree of attenuation. The present invention provides a mechanism for either overcoming leakage of external sounds that can and should be ignored, and providing control of the gain of the audio program playback when external sounds should not be ignored. Further, while the present invention and this disclosure are directed primarily toward audio playback, devices in accordance with the present invention can also be personal video playback devices or game units, and the techniques disclose and claimed herein extend to the processing of audio information provided by the video or game sources.

Figure 3:
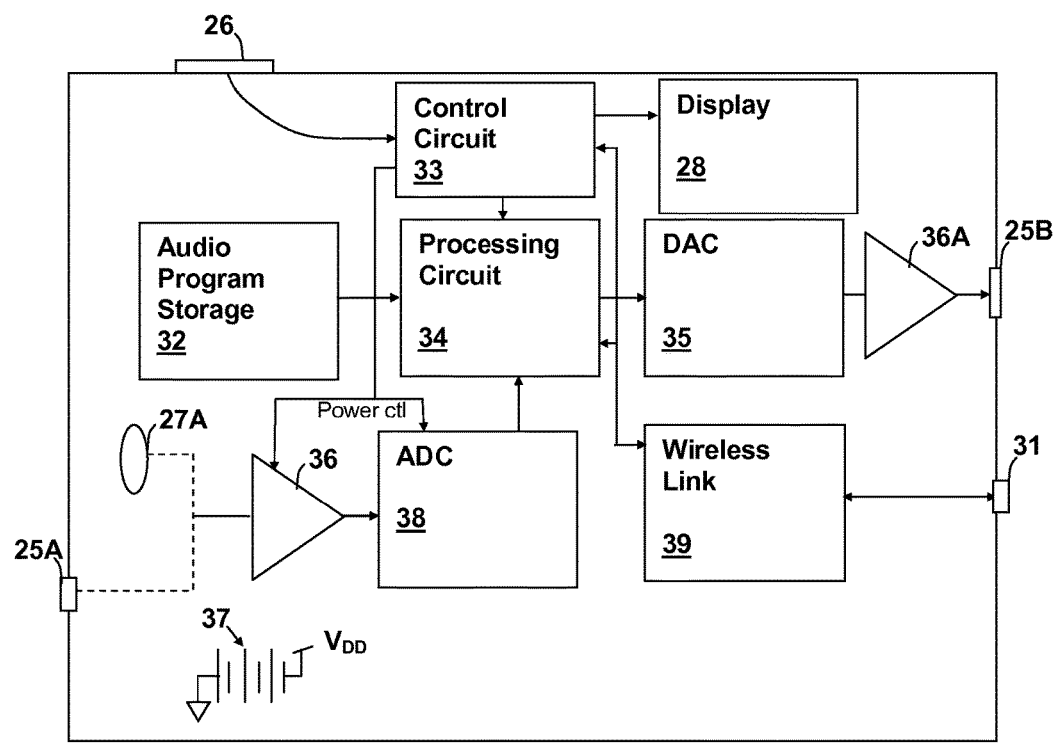
FIG. 3 is a block diagram depicting internal circuits of a consumer personal audio playback device in accordance with an embodiment of the present invention.

Referring now to FIG. 3, a block diagram of electrical circuits within the above-described consumer personal audio playback devices is shown. Audio program storage 32, which as mentioned above can include the audio portion of video program material or computer program-generated audio sources such as game or Musical Instrument Device Interface (MIDI) information playback, provides the program source material. For digital audio playback devices, storage 32 will generally be a FLASH memory, magnetic disc or optical disc or array that encodes binary representations of audio as compressed or uncompressed numerical information. Processing circuit 34 performs gain control and rendering of the program information retrieved from storage 32 and provides the result to a digital-to-analog converter (DAC) 35 that converts the processed program information to analog form that is provided to a headphone amplifier 36A connected to headphones via a connector 25B or via a direct connection as shown above with respect to the device of FIG. 1.

Microphone element 27A and/or microphone connector 25A provides one or more electrical signals corresponding to environmental sounds that are amplified by preamplifier 36 and converted via an analog-to-digital converter (ADC) 38 to digital information provided to processing circuit 34. While the depicted circuits are digital in nature, the present invention can include direct gain control of the output of DAC 35 via an analog level detection of the output of preamplifier 26 or other processing of the program by analog means, including analog multi-band compression. The sampling rate and bandwidth of the microphone signal can be set much lower than that used for recording in personal devices in order to save power. Further, the measurements can be made periodically, with ADC 36 and preamplifier 36 shut down between measurement intervals in order to conserve battery power.

Control circuit 33 has a power control output coupled to preamplifier 26 and/or ADC 38 that can selectively adjust the power consumption of preamplifier 26 and/or ADC 38 by changing the type of amplifier employed as preamplifier 26 or altering bias currents, as well as adjusting the sampling rate and/or bit depth of ADC 38. ADC 38 and preamplifier 26 also may be disabled when microphone input is not required and/or periodically enabled when only periodic monitoring is required. While background noise and sounds are being monitored, a lower sampling rate and bit depth of ADC 38 can be employed, and lower performance can be tolerated from preamplifier 26. Multiple power levels can be supported so that when the personal device is operating in one of the conversation modes described below, an intermediate power level may be selected for conversations, a low power level may be selected for monitoring the background, and a high power level may be selected for recording modes.

Controls 26 are connected to control circuit 33, which is generally a microcontroller or microprocessor with program and data storage memory, for controlling the playback of the stored program information and selectable operating mode of the consumer personal audio device as will be described in further detail below. Display 28 is coupled to control circuit 33 to provide menus for operating the device, and may also provide playback of stored video information.

Processing circuit 34 is generally a digital signal processor with data and program memory, as well, and may be the same processor as control circuit 33. A battery 37 supplies power to the internal circuits of the consumer personal audio device.

A wireless link circuit 39 is coupled to a transducer 31, which may be an antenna or infrared transducer, for providing communication with external remote control devices such as remote control 14 of FIG. 1, or communication with other personal audio playback or other devices as provided in some of the operating modes described below. Further, the wired connection of headphones and microphone elements as described above may be replaced with completely wireless communications via wireless link 39, with suitable amplification circuits and transceivers located within the microphone/headphone element packages. Wireless link circuit 39 may also provide input to processing circuit 34 and/or control circuit 33 for control of the gain of audio program material rendered from storage 32 in certain operating modes of processing circuit 34 as will be described in further detail below.

Compressor Mode

As mentioned above, there are multiple operating modes that the above-described consumer personal audio devices can enter, and the particular algorithm used to control the gain of the audio program material will vary depending on the selected mode. In the most basic "compressor" mode, selected to overcome environmental sounds in general, the gain of low levels of program audio is adjusted upward in conformity with the detected loudness of the external sounds. Processing circuit 34 acts as an electronic volume control that increases the gain of the program audio as ambient noise increases. However, the gain of higher levels of program audio are not increased linearly, but are adjusted according to a "soft knee" compression curve that causes less incremental increase in program material for larger increases in ambient noise as higher levels of audio are reached.

Compressor mode is particularly useful with "leaky" headphones and will provide adjustment of volume so that in quiet environments, a low level of volume of the program audio is produced, while in noisy environments, a higher level of volume is produced, up to a safety limit, which may either be set by the design of headphone amplifier 36A, an output resistance of the headphone circuit, or the limiting action of the above-described compression curve provided by the mode processing algorithm employed in the selected mode.

Multi-Band Compressor Mode

A multi-band compressor mode, which may be selectable or may be the only expander mode implemented within the personal device, provides more hearing protection while overcoming environmental noise by analyzing the microphone signal provided by ADC 38, to detect the loudness of the environmental noise in multiple frequency bands. The detected levels of loudness are used to control compression of the program material gain in multiple frequency bands by splitting the program material into corresponding frequency bands and independently controlling the gain of the signal provided in each band to DAC 35. The loudness of the program material in each frequency band can also be detected, and a combination of the loudness of the program material and the detected environmental noise level in each band can be used to control the gain of the signal supplied to DAC 35 in each frequency band.

The frequency bands can be selected according to the Bark scale of hearing discrimination, the Mel scale, or other suitable set of bands. Table 1 shows psycho-acoustic equalization algorithm gain increase values that can be provided in look-up tables or implemented in continuous control functions in order to accomplish the above-described gain control. Table 2 shows the corresponding resultant output levels from the gain processing algorithm or circuit (compressor). The compressor is a variable-ratio compressor, with the ratio set by the level of the background noise, so that for larger levels of background noise, smaller gains are applied, i.e., the amount of compression is increased. For example, in the left-hand column corresponding to a relative background noise level of 20 dB, changes in program material of 10 dB yield changes in the gain of 2 dB, and thus output level changes of 8 dB (a 1.25:1 compression slope). In the extreme right-hand column, 10 dB changes in program material yield 8 dB changes in gain and thus 2 dB changes in output level (a 5:1 compression ratio).

TABLE 1

Applied Gain Value

| program | Background noise level | | | | | | |
|---|---|---|---|---|---|---|---|
| level | 20 dB | 30 dB | 40 dB | 50 dB | 60 dB | 70 dB | 80 dB |
| 100 dB | 0 | 0 | 0 | 0 | 0 | 0 | 0 |
| 90 dB | 2 | 3 | 4 | 5 | 6 | 7 | 8 |
| 80 dB | 4 | 6 | 8 | 10 | 12 | 14 | 16 |
| 70 dB | 6 | 9 | 12 | 15 | 18 | 21 | 24 |
| 60 dB | 8 | 12 | 16 | 20 | 24 | 28 | 32 |
| 50 dB | 10 | 15 | 20 | 25 | 30 | 35 | 40 |
| 40 dB | 12 | 18 | 24 | 30 | 36 | 42 | 48 |
| 30 dB | 14 | 21 | 28 | 35 | 42 | 49 | 56 |
| 20 dB | 16 | 24 | 32 | 40 | 48 | 56 | 64 |

TABLE 2

Resulting Output Level

| program | Background noise level | | | | | | |
|---|---|---|---|---|---|---|---|
| level | 20 dB | 30 dB | 40 dB | 50 dB | 60 dB | 70 dB | 80 dB |
| 100 dB | 100 dB | 100 dB | 100 dB | 100 dB | 100 dB | 100 dB | 100 dB |
| 90 dB | 92 dB | 93 dB | 94 dB | 95 dB | 96 dB | 97 dB | 98 dB |
| 80 dB | 84 dB | 86 dB | 88 dB | 90 db | 92 dB | 94 dB | 96 dB |
| 70 dB | 76 dB | 79 dB | 82 dB | 85 dB | 88 dB | 91 dB | 94 dB |
| 60 dB | 68 dB | 72 dB | 76 dB | 80 dB | 84 dB | 88 dB | 92 dB |
| 50 dB | 60 dB | 65 dB | 70 dB | 75 dB | 80 dB | 85 dB | 90 dB |
| 40 dB | 52 dB | 58 dB | 64 dB | 70 dB | 76 dB | 82 dB | 88 dB |
| 30 dB | 44 dB | 51 dB | 58 dB | 65 dB | 72 dB | 79 dB | 86 dB |
| 20 dB | 36 dB | 44 dB | 52 dB | 60 dB | 68 dB | 76 dB | 84 dB |

The above-described multi-band compression mode algorithm avoids the problems of merely increasing overall gain that may result in unnecessary clipping or an increase in volume above safe listening levels in order to overcome background noise. As mentioned above, the multi-band compression mode (or the single-band compression mode) can be implemented by a signal processing algorithm according to program instructions stored within a memory of processing circuit 34 or by dedicated circuits.

Personal Safety Mode

Another useful mode that is implemented by a signal processing algorithm according to program instructions stored within a memory of processing circuit 34 or a dedicated circuit is a personal safety mode. In personal safety mode, sudden changes in volume, or particular frequency patterns such as vehicle horns or loud voices, are detected and processing circuit 34 either partially or completely attenuates the program material gain, so that a user of the personal audio playback device will hear the outside sounds. The microphone input can be provided at the headphone output and/or mixed with the program audio, so that the user is made more aware of the external environment while the sound is present, and optionally for some time thereafter according to a timer and timing value implemented by processing circuit 34.

Social Mode

Similar to the personal safety mode, in social mode, also implemented by a signal processing algorithm according to program instructions stored within a memory of processing circuit 34 or a dedicated circuit, speech of another person is detected and the program material is attenuated, so that a user of the personal audio playback device can converse with another person. The microphone input can be provided at the headphone output and/or mixed with the program audio, so that the user is able to hear the other person quite well without requiring removal of headphone elements. A timer can be used to restore the program material after a period without speech by either the user or the other person is detected.

Environment Match Mode

In yet another mode, implemented in an algorithm of processing circuit 34 and/or control circuit 33, a type of outside environment is determined by analyzing the output of ADC 38 for loudness, frequency character and other clues such as pattern matching. Program material can be selected from storage 32 in conformity with the detected environment in order to play back a compatible program. For example, automotive sounds might cause selection of rock music, quiet environments might select New Age music, and conversation might select rap music. Such selection may set a compatible mood in the user and/or more effectively mask external sounds.

Linked Chat Mode

Similar to conversation mode, in chat mode, also implemented by a signal processing algorithm according to program instructions stored within a memory of processing circuit 34 or a dedicated circuit, speech of the user (wearer) is detected and transmitted to another device via wireless link 39. The program material is paused or attenuated for both devices until a timer has expired and the other device can transmit audio information directly from the other device's microphone circuits to the device of FIG. 3, so that the other device-user's speech is sent to headphone amplifier 36A and connected headphone elements.

Review Mode

Another mode provided by the personal audio playback device of the present invention, is a review mode in which a portion of storage 32 or another memory is dedicated to storing the ADC 38 output in a FIFO buffer. If a portion of the preceding external sounds (such as a lecture) is missed, the contents of the buffer can be reviewed via controls 26 that provide for reviewing the program material.

In personal safety mode, social mode and linked chat mode, as well as any other modes for which the program material would otherwise be interrupted or severely attenuated, a sub-mode can be implemented in which the program material is either paused at or rewound to the point at which the interruption began, so that the program material is not missed. Such a sub-mode is particularly useful when listening to such material as "books on tape", lectures or other informational program sources.

In each of the above modes where the character of external environmental sounds is being determined, the use of multiple microphones, such as microphone elements 17 and 17A, provides for the possibility of determining the direction of the environmental sound source. In such an implementation, it is possible to determine whether a person speaking or other sound is coming from the space directly in front of the user/wearer and selection of activation of such modes as social mode or linked chat mode made in conformity with the determination. Also, the mode can be initiated in this manner, and then subsequently maintained, so that two persons can walk astride while the mode is continued.

Further, each of the above-described modes, as well as a default playback and optionally a default recording mode may be selectable manually via controls, or as noted above for some modes such as the conversation modes, e.g. linked chat and social modes may be automatically engaged (when enabled) upon detecting the appropriate indication from the environment or from another device. Additionally, personal safety mode or either of the expander modes might be permanently and simultaneously implemented without a control for disabling the feature. Most of the above-described modes are also not mutually exclusive and therefore can be engaged at one time. While compression mode will generally be single or multi-band, the other modes can be implemented simultaneously in a single device and each may be selectively enabled without interfering with the others as illustrated below.

Figure 4:
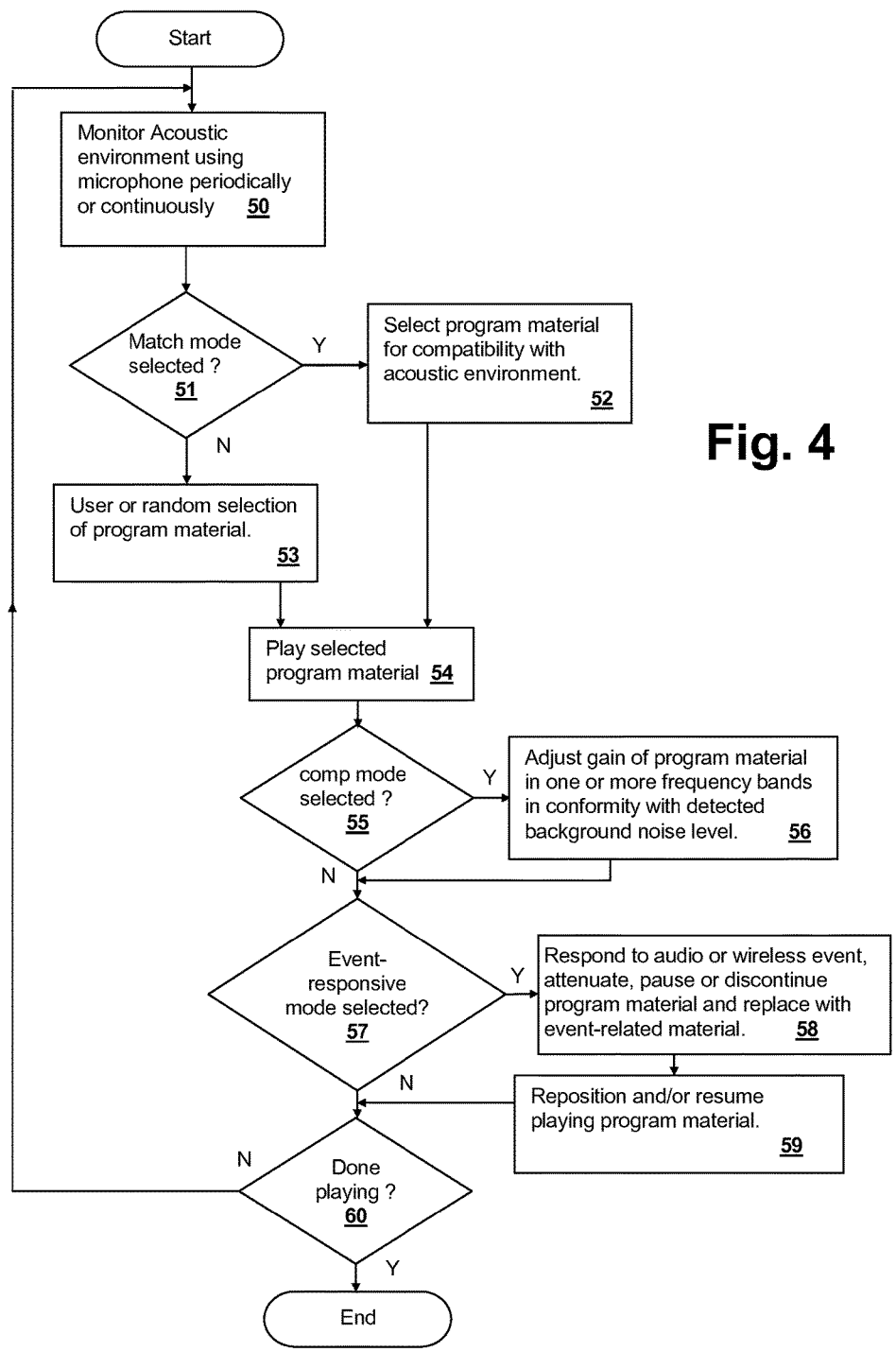
FIG. 4 is a flowchart depicting operation of a consumer personal audio playback device in accordance with an embodiment of the present invention.

Referring now to FIG. 4, operation of the above-described personal consumer audio playback devices is shown in a flowchart. The acoustic environment is monitored either periodically or continuously as described above (step 50). If environment match mode is enabled (decision 51), then environmentally-compatible program material is selected for playback (step 52), otherwise, normal user or random selection of program material is made (step 53). The selected program material is played (step 54) and if a compression mode is selected (decision 55), the gain of the program material is adjusted in one or more frequency bands in conformity with the detected background noise level (step 56), If an event responsive mode is selected (decision 57), then the device will respond to an ambient audio or wireless event by attenuating, pausing or discontinuing playback of the program material and replacing it in the audio output with event-related material (step 58). For example, in linked chat mode the program material is replaced with the wireless received speech, in social and personal safety modes, the program material is replaced with the sounds received by the device microphone(s). A predetermined time after the event has passed, the program material is repositioned and/or resumed (step 59). Until playback is complete, or the device is disabled (decision 60), the ambient audio environment is continually monitored and the above-described steps repeated.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A portable consumer audio playback device, comprising:
    a compact consumer audio device housing;
    an audio output adapted for connection to at least one headphone for transforming one or more output electrical signals to sound;

a microphone input for connection to a microphone element for sensing ambient sounds external to the housing and producing an ambient measuring audio signal;

an audio program source for providing input of audio program information; and an audio processor for detecting speech in the ambient sounds from the ambient measuring audio signal, wherein the audio processor adjusts a characteristic of the audio program information in response to detection of the speech, wherein the audio processor further determines a direction of the speech in the ambient sounds and adjusts the characteristic of the audio program information in response to the direction of the speech indicating that the speech is not speech of a user of the portable consumer audio playback device.

2. The portable consumer audio playback device of claim 1, wherein the audio processor attenuates the audio program information in response to the detection of the speech.

3. The portable consumer audio playback device of claim 1, wherein the audio processor restores a volume level of the audio program information after a predetermined time has elapsed after the detection of the speech indicates that the speech has ended.

4. The portable consumer audio playback device of claim 1, wherein the audio processor provides the ambient measuring audio signal in the one or more output electrical signals in response to the detection of the speech, whereby the audibility of the speech by a user of the portable consumer audio playback device is enhanced.

5. The portable consumer audio playback device of claim 4, wherein the audio processor further attenuates the audio program information in response to the detection of the speech.

6. The portable consumer audio playback device of claim 1, wherein the compact consumer audio device housing is a housing of the at least one headphone wherein the audio output is adapted for connection to a transducer of the at least one headphone internal to the compact consumer audio device housing, wherein the microphone input receives a signal from a microphone integrated on the compact consumer audio device housing, and wherein the audio processor is integrated within the compact consumer audio device housing.

7. A method of processing audio program information in a portable consumer audio playback device, the method comprising:

reproducing audio program information by providing one or more output electrical signals to at least one headphone;

sensing ambient sounds external to a housing of the portable consumer audio device housing;

detecting speech in the ambient sounds sensed by the sensing;

determining a direction of the speech; and adjusting a characteristic of the audio program information in response to the detection of the speech and in response to the direction of the speech indicating that the speech is not speech of a user of the portable consumer audio playback device.

8. The method of claim 7, further comprising attenuating the audio program information in response to the detection of the speech.

9. The method of claim 7, further comprising restoring a volume level of the audio program information after a predetermined time has elapsed after the detection of the speech indicates that the speech has ended.

10. The method of claim 7, further comprising providing the speech in the one or more output electrical signals in response to the detection of the speech to enhance the audibility of the speech by a user of the portable consumer audio playback device.

11. The method of claim 10, further comprising attenuating the audio program information in response to the detection of the speech.

12. The method of claim 7, wherein the portable consumer audio playback device is contained within a housing of the at least one headphone, and wherein the sensing is performed by a microphone integrated on the housing.

13. An integrated circuit for implementing at least a portion of a portable consumer audio playback device, comprising:

an audio output adapted for connection to at least one headphone for transforming one or more output electrical signals to sound;

a microphone input for connection to a microphone element for sensing ambient sounds external to the housing and producing an ambient measuring audio signal;

a program input for receiving audio program information;

an audio processor for detecting speech in the ambient sounds from the ambient measuring audio signal, wherein the audio processor adjusts a characteristic of the audio program information in response to detection of the speech, wherein the audio processor further determines a direction of the speech in the ambient sounds and adjusts the characteristic of the audio program information in response to the direction of the speech indicating that the speech is not speech of a user of the portable consumer audio playback device.

14. The integrated circuit of claim 13, wherein the audio processor attenuates the audio program information in response to the detection of the speech.

15. The integrated circuit of claim 13, wherein the audio processor restores a volume level of the audio program information after a predetermined time has elapsed after the detection of the speech indicates that the speech has ended.

16. The integrated circuit of claim 13, wherein the audio processor provides the ambient measuring audio signal in the one or more output electrical signals in response to the detection of the speech, whereby the audibility of the speech by a user of the portable consumer audio playback device is enhanced.

17. The integrated circuit of claim 13, wherein the audio processor further attenuates the audio program information in response to the detection of the speech.

* * * * *